(12) United States Patent
Kothari

(10) Patent No.: US 12,027,882 B2
(45) Date of Patent: Jul. 2, 2024

(54) SMART RECTENNA DESIGN FOR PASSIVE WIRELESS POWER HARVESTING

(71) Applicant: Cisco Technology, Inc., San Jose, CA (US)

(72) Inventor: Shanay Ravin Kothari, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 510 days.

(21) Appl. No.: 17/408,291

(22) Filed: Aug. 20, 2021

(65) Prior Publication Data

US 2021/0384775 A1  Dec. 9, 2021

Related U.S. Application Data

(62) Division of application No. 16/107,962, filed on Aug. 21, 2018, now Pat. No. 11,121,582.

(51) Int. Cl.
| | |
|---|---|
| *H02J 50/27* | (2016.01) |
| *H01Q 1/24* | (2006.01) |
| *H02J 50/80* | (2016.01) |
| *H03H 7/38* | (2006.01) |

(52) U.S. Cl.
CPC .............. *H02J 50/27* (2016.02); *H01Q 1/248* (2013.01); *H02J 50/80* (2016.02); *H03H 7/38* (2013.01); *H03H 2007/386* (2013.01)

(58) Field of Classification Search
None
See application file for complete search history.

(56) References Cited

U.S. PATENT DOCUMENTS

| | | |
|---|---|---|
| 2009/0152954 A1 | 6/2009 | Le et al. |
| 2012/0157026 A1 | 6/2012 | McKinzie et al. |
| 2013/0033118 A1* | 2/2013 | Karalis ............... B60L 53/126 307/104 |
| 2017/0093168 A1 | 3/2017 | Von Novak, III et al. |
| 2017/0302097 A1* | 10/2017 | Kim .................... H02J 50/10 |
| 2018/0337444 A1* | 11/2018 | Arnitz .............. H01Q 15/0086 |
| 2019/0067802 A1 | 2/2019 | Carter et al. |
| 2019/0258833 A1 | 8/2019 | Caselli et al. |

* cited by examiner

*Primary Examiner* — Jared Fureman
*Assistant Examiner* — Joel Barnett
(74) *Attorney, Agent, or Firm* — Polsinelli P.C.

(57) ABSTRACT

The present technology is directed to a system and method for implementing passive power harvesting from ambient electromagnetic emissions with a smart rectenna that incorporates automatic frequency response tuning features. The disclosed system incorporates a tunable High Pass Filter and voltage multiplier rectifier with a front-end ultra wide band antenna unit. The frequency response of tunable components can be actively adjusted to match the frequency band containing most of the energy in the incident electromagnetic emission. A look up table is used for determining the appropriate biasing levels of the tunable components for each frequency in a frequency band of interest. By tuning a frequency response of impedance matching, filtering and rectifying components to correspond to a frequency region of maximum power spectral density in the incident energy signal, the system facilitates the scavenging of ambient electromagnetic energy from the spectral region with the highest power spectral density.

20 Claims, 6 Drawing Sheets

SMART RECTENNA DESIGN FOR PASSIVE WIRELESS POWER HARVESTING

CROSS-REFERENCE TO RELATED APPLICATION

This application is a division of U.S. Non-Provisional patent application Ser. No. 16/107,962, filed on Aug. 21, 2018, the full disclosure of which is hereby expressly incorporated by reference in its entirety.

TECHNICAL FIELD

The present technology pertains to rectenna based ambient power harvesting. More specifically it is directed to a tunable rectenna for ambient power harvesting.

BACKGROUND

With the explosive and rapid development of wireless technologies, the ambient wireless power density is growing due to an increasing number of various electromagnetic power sources such as the cellular mobile base stations, digital TV towers and Wi-Fi routers. The idea of utilizing the radio frequency (RF) energy to power low-power electronic devices has gained a lot of popularity in recent years as a replacement or a supplement to battery units in order to save maintenance cost. The use of batteries as an energy source has two disadvantages: the lifetime of the batteries is very limited even for low-power batteries, requiring impractical periodical battery replacement, the use of commercial batteries usually overkills the power requirements for low power (in the range of microwatts) sensor nodes, adding size and weight while creating the problem of environmental pollution due to the deposition of these batteries, as well as increases significantly the cost overhead of disposable nodes.

The meaning of Energy Harvesting (also called energy scavenging or power harvesting), is the process by which energy from different sources is captured and stored. Generally, this definition applies to autonomous devices that require a low amount of energy to function. Currently, energy harvesters do not provide sufficient amount of power to produce mechanical movements or temperature changes (ovens, refrigerators, etc) because there aren't technologies that capture energy with great efficiency.

Another advantage of energy harvesting technologies is that, unlike the production of large-scale power, the relevant energy sources are practically free when taking into account, for example, the electromagnetic energy of transmitting mobile stations and radio and TV broadcasting antennas.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Figure 1:
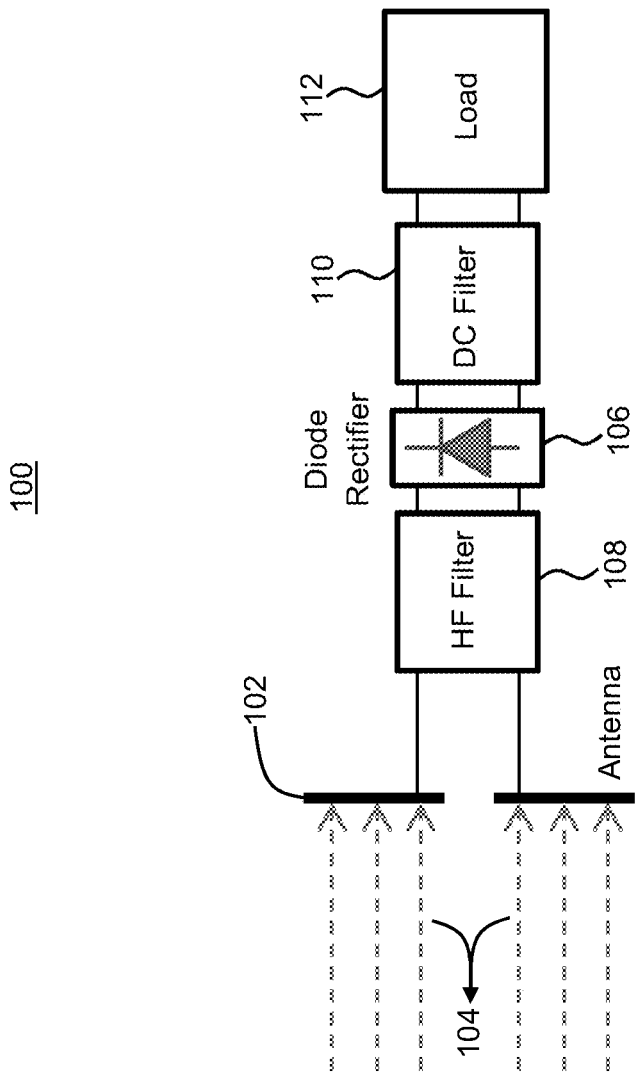
FIG. 1 illustrates a rectenna in accordance with some aspects of the present technology.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Overview

Systems, methods, and devices are disclosed for implementing an optimal efficiency passive wireless power harvesting for a rectenna. Aspects of the technology are directed to deploying impedance matching, filtering and rectifying components having a tunable frequency response. According to an embodiment, the frequency response of the one or more components may be rendered tunable by utilizing one or more signal-controlled variable elements (such as voltage controlled variable capacitors) in the constructions of the components having a tunable frequency response. The frequency response of the rectenna's constituent components may then be tuned by one or more tuning signals generated in accordance to tuning parameters stored in a lookup table. The lookup table stored tuning parameters may comprise electrical parameters (i.e., voltage values required for adjusting/tuning a capacitance or inductance value of one or more voltage-controlled capacitors or inductors in such a way so as to facilitate one or more desired output frequency responses) corresponding to various desired output frequency responses for each input radio frequency within a desired frequency band. The Lookup table may be stored/maintained on one or more non-volatile storage elements and utilized to configure the one or more tuning signals depending on the input radio frequency incident upon the front-end antenna unit. The tuning signals may be analog or digital in nature.

Embodiment of the technology provide a system for passive wireless power harvesting, comprising of first component, having a first tunable frequency response, and a first input side configured to receive a radio frequency electrical signal from an antenna, as well as a second input side configured to receive one or more tuning signals. The first component additionally includes an output side electrically coupled to an input side of a second component which also has a tunable frequency response. The second component, in addition to having an input side for electrically coupling to the output of the first component, may also include another input side that is configured to receive one or more tuning signals. The output of the second component may then be configured to deliver a DC electrical signal to a load.

The system as provided by embodiments of the disclosed technology may also include a computer-readable storage element for storing a lookup table. The lookup table may be utilized for storing relevant information for configuring the one or more tuning signals. For example the information in the lookup table may include one or more parameters for optimally tuning the tunable frequency responses of the first and the second components for one or more selected spectral bands.

Embodiments of the disclosed technology also describe a method for implementing passive wireless power harvesting. The example method for effectively accomplishing passive wireless power harvesting may include looking up one or more stored tuning parameters corresponding to one or more desired spectral bands, to thereby produce a desired frequency response in one or more tunable components of a rectenna. The desired frequency response may correspond to an optimal power transfer, in one or more desired spectral bands, to and from the one or more tunable components. By transmitting the one or more stored tuning parameters to the one or more tunable components, as prescribed by embodiments of the disclosed method, a frequency response of the one or more tunable components may be accordingly adjusted in such a way so as to maximize power transfer within the one or more desired spectral bands.

In some embodiments of the technology, the first component may comprise a high pass filter, and include a section for providing impedance matching between the antenna and the second component. Other possible features of the first component may include one or more voltage controlled capacitors utilized to facilitate the tunable frequency response of the first component. With respect to the lookup table, the one or more parameters that are stored in the lookup table for use in optimally configuring the one or more tuning signals, may comprises one or more voltage values. These lookup table stored voltage values may then be transmitted to the first component in order to tune the one or more voltage controlled variable capacitors of the first component in such a way to, for example, provide impedance matching between the antenna and the second component. This will increase an amount of power transferred from the first component to the second component within the one or more selected spectral bands.

The second component, in some embodiments, may comprise a rectifier unit, to provide the necessary rectification of the antenna's AC signal. Moreover the second component may also include a voltage multiplication unit. In some embodiment, a voltage doubling capability may suffice for producing a desired outcome, therefore in some embodiments the second component may include a voltage doubling unit in addition to a rectifier unit. The second component may further comprise a section for providing impedance matching to the load. The second component may also feature a tunable frequency response. In some embodiments, a tunable frequency response may be facilitated by one or more voltage controlled variable capacitors in the second component. Therefore the one or more parameters based on which the one or more tuning signals may be configured, may comprise one or more voltage values for tuning the one or more voltage controlled variable capacitors of the second component. The tuning operation then provides for maximum power transfer for each of a plurality of input radio frequencies in the one or more selected spectral bands.

EXAMPLE EMBODIMENTS

Disclosed are systems, methods, for smart Rectenna design with frequency response tuning features to dynamically adjust a frequency response of the Rectenna system to appropriate range that optimizes the operation of the system and maximizes the harvested power. Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Wireless energy harvesting by using rectifying antenna (rectenna) technologies is a feasible solution to convert the ambient electromagnetic power to a usable DC power. A rectenna, rectifying antenna, is a special type of antenna that is used to convert electromagnetic energy into direct current (DC) electricity. Rectennas are widely adopted devices for the wireless power transmission and energy harvesting. A rectenna is a passive element with rectifying diodes that operates without an internal power source. It can receive and rectify electromagnetic power to DC electrical power. A simple rectenna element may consist of a dipole antenna with a radio frequency (RF) diode connected across the dipole elements. The diode rectifies the Alternating Current (AC) induced in the antenna by the electromagnetic radiation to produce Direct Current (DC) power which powers a load connected across a diode. Schottky diodes are usually used because they have a low voltage drop and high speed and therefore have low power losses due to conduction and switching.

A general block diagram of an example rectenna 100 is shown in FIG. 1. Rectenna 100 consists of a receiving antenna 102 which captures electromagnetic (EM) waves 104, and an EM-to-DC (electromagnetic energy to direct electrical current) rectifying circuit 106 which converts the received electromagnetic energy 104 into electrical energy. The EM-to-DC conversion process produces high order harmonic components because of the non-linear characteristic of diodes (or transistors) components. These frequency components are highly unwanted; they could decrease efficiency and create electromagnetic pollution; and it is essential to filter them. An input high frequency (HF) filter 108, placed between the antenna 102 and the rectifier 106 provides impedance matching between the antenna 102 and the diode rectifier 106 around a central frequency (~2.45 GHz) for better power transfer. In effect HF filter 108 introduces additional impedance between antenna 102 and the rectifier 106 in such way the input impedance of rectifier 106 is better matched with output impedance of the previous stage that is electrically coupled to it. This will increase the power transfer from antenna 102 to rectifier 106 as well as reduce signal reflection resulting from mismatch between the output impedance of the antenna 102 and input impedance of the rectifier 106.

Referring back to the example rectenna 100 in FIG. 1, the input HF filter 108 further prevents high order harmonics to be radiated by the antenna into the rectification circuitry. This approach improves the amount of power transferred between the antenna and the rectifier and also the electromagnetic to electrical (DC) energy conversion efficiency. After rectification, an output DC filter 110 transmits the DC component to a load 112 and filters out all high frequencies (HF). Thereby, all high order harmonics are confined between the input HF filter 108 and the DC output filter 110.

As addressed earlier, the use of rectennas is an efficient way for harvesting ambient electromagnetic (EM) energy, which is a solution for trickle charge and battery life extensions for indoor low power Internet of Things (IoT) devices for both home and enterprise devices. However rectennas have to be optimized or tuned to a particular frequency response in order to maximize energy harvesting at input frequencies of interest. As such, most rectenna implementations are tuned to a specific frequency region and hence do not have the flexibility to capture ambient electromagnetic energy from other frequency region. If the frequency region for which a rectenna is optimized does not coincide with the frequency region of maximum power spectral density (PSD) in the incident electromagnetic energy signal, the overall conversion efficiency of the rectenna will drop significantly. This idea may be better explained by referencing FIG. 2 which shown a trace diagram 200 consisting of an indicia 202 representing a 3 dB bandwidth of a passive rectenna and a Power Spectral Density (PSD) plot 204 for a typical 2.4 GHz ISM Band.

The industrial, scientific, and medical radio band (ISM band) refers to a group of radio bands or parts of the radio spectrum that are internationally reserved for the use of radio frequency (RF) energy intended for scientific, medical and industrial requirements rather than communication. ISM equipment generates electromagnetic interference that interrupts radio communications that make use of the same frequency. Therefore, such equipment were restricted to specific frequency bands. However there has been a rapid growth in the use of ISM band in low-power, short-range communications platforms. Bluetooth devices, cordless phones, Wi-Fi computer networks, and Near Field Communication (NFC) devices all make use of ISM bands. In 1985, the U.S. Federal Communications Commission opened the ISM bands for use in mobile communications and wireless LANs.

Referring back to FIG. 2, the PSD plot 204 represents the energy/power (in terms of gain) contained in different frequency components of a typical ISM band RF signal. The bandwidth of a passive rectenna (range of frequencies outside of which the gain of the device falls by 50% or 3 dB) is represented by a frequency range 202 centered around a primary frequency (~2.45 GHz) 206. What this means is that for a passive rectenna design the frequency region corresponding to rectenna's maximum conversion efficiency is centered on a single frequency 206 with a limited 3 dB bandwidth 202 extending around the center frequency 206.

Figure 2:
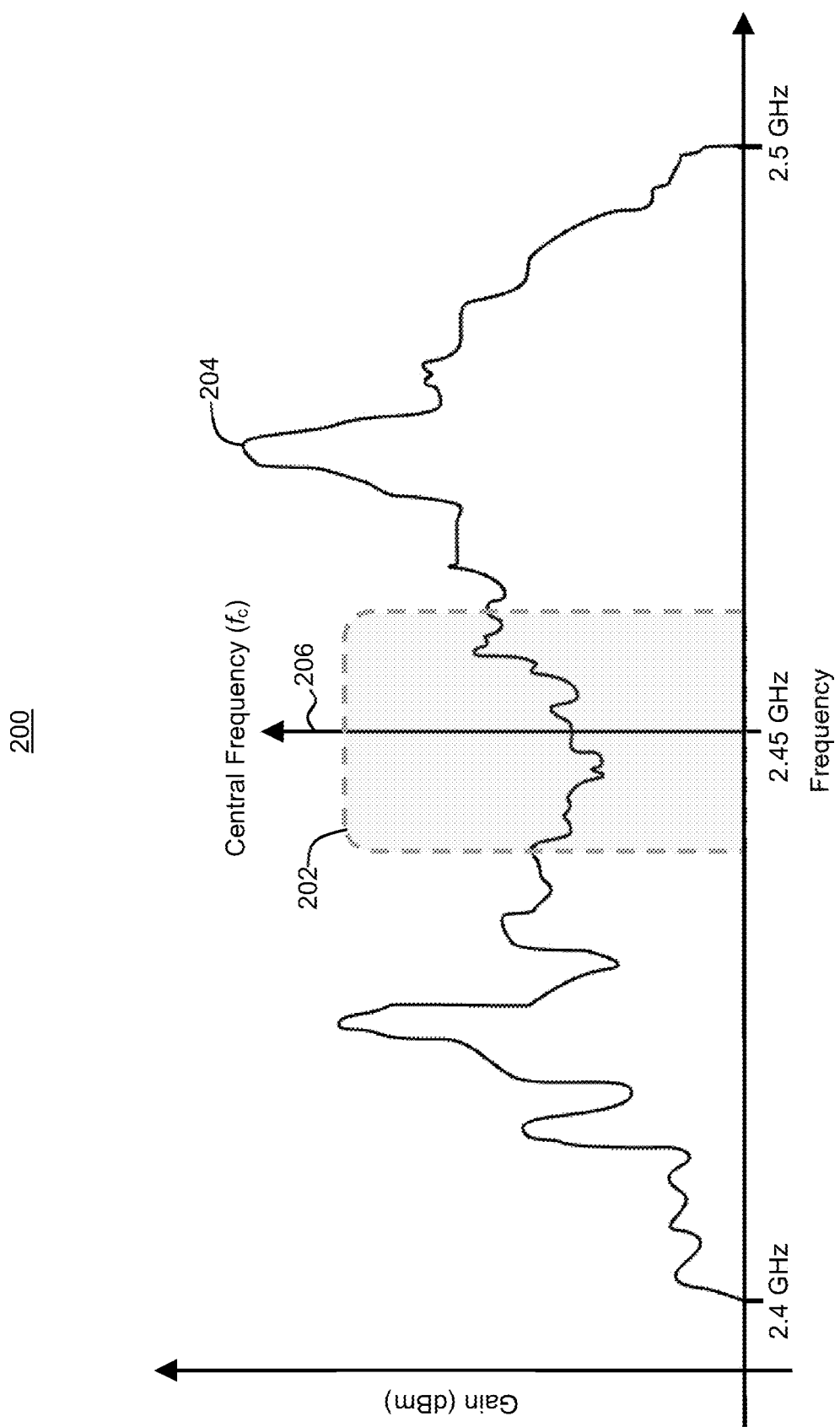
FIG. 2 illustrates a Power Spectral Density plot of a typical 2.4 GHz ISM band with a 3 dB bandwidth of a standard passive rectenna in accordance with some aspects of the present technology.

Therefore, as can be observed from FIG. 2, the frequency region corresponding to the maximum power spectral density in an incident energy signal may not fall within a frequency range 202 corresponding to the bandwidth of a passive rectenna. Therefore a passive architecture may or may not be harvesting ambient electromagnetic energy from the region of maximum PSD. Alternatively, a frequency agile recetanna architecture capable of shifting its operational center frequency to the region of maximum power spectral density in the incident electromagnetic signal would maximize electric power harvested from the incident electromagnetic signal.

Aspects of the present technology describe a solution for improving electromagnetic to electrical DC energy conversion efficiency in a rectenna. Embodiments of the present technology include a system and method for implementing a smart rectenna capable of adjusting its frequency response to the spectral region of the maximum power spectral density in the incident energy signal, to thereby achieve improved conversion efficiency.

Some embodiments of the present technology describe a system and method based on pairing an Ultra Wideband (UWB) front end antenna with a holistically frequency tunable rectifying circuit to thereby implement a system directed at standardizing conversion efficiency over a wide frequency band.

A rectenna's total efficiency in converting ambient electromagnetic energy (i.e., incident Radio Frequency (RF) signal) to Direct Current (DC) electrical energy) depends upon the efficiency factors associated with the performance of its key components. One such factor involves the efficient absorption of the incident RF signal at the desired frequency. Another contributing factor to the total efficiency of the rectenna is the performance efficiency of the impedance matching stage between the antenna unit and the rectifier to thereby ensure good power transfer to the rectification circuitry of the rectenna. Improving rectenna total conversion efficiency also necessitates an efficient impedance matching stage between the rectifier and output load to minimize signal loss in transferring the rectified DC signal (output of the rectifier unit) to the load. It is also important, with respect to improving total efficiency of rectenna, to minimize the power loss through the rectification diode (represented by the voltage drop across the diode).

In accordance with some embodiments of the present technology, the antenna efficiency criteria (involving RF absorption at desired frequencies) is addressed by utilizing an Ultra Wideband (UWB) antenna with bandwidth exceeding 7 GHz in the design with an smart rectenna, as disclosed herein. The smart rectenna provides for near uniform antenna efficiency over the wide bandwidth supported by the Ultra Wideband (UWB) antenna.

The smart functionality of the proposed rectenna system, in accordance with some embodiments, is implemented by actively modulating bias voltage levels of one or more tunable components in such a way so as to a tune their operation to a desired frequency range associated with incident electromagnetic signal. In some embodiments, this is achieved through the use of a Lookup Table (LUT) in conjunction with Digital to Analog Converter (DAC) to directly change the bias level on one or more analog tunable components constituting the smart rectenna.

Figure 3:
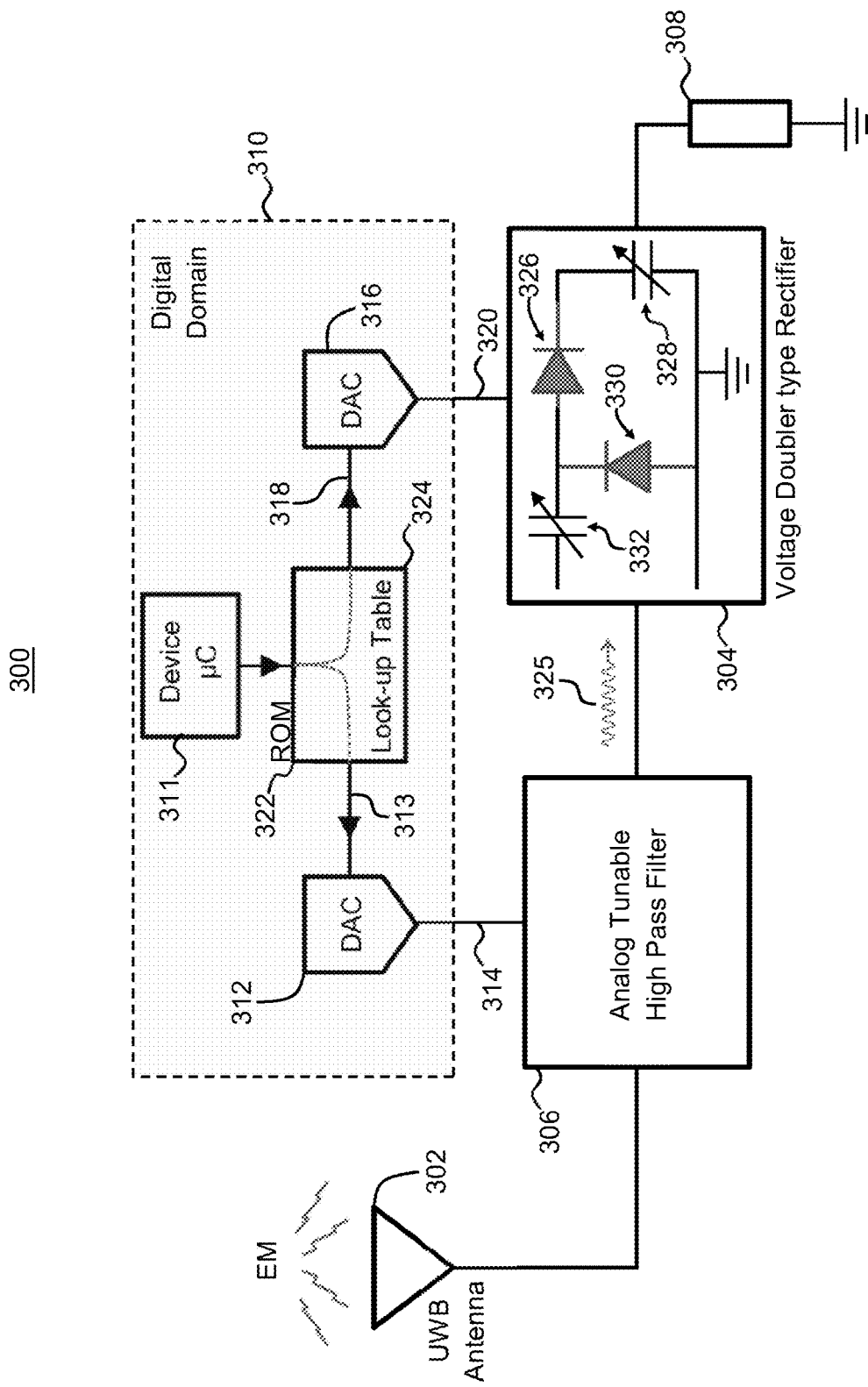
FIG. 3 illustrates an exemplary Lookup Table based approach for smart rectenna design, with an analog tuning feature, in accordance with some aspects of the present technology.

FIG. 3 illustrates a system diagram for an exemplary smart rectenna 300 implemented in accordance with some embodiments of the present technology. Rectenna 300 comprises an Ultra Wideband (UWB) Antenna 302 connected to voltage doubling rectifier unit 304 through a high pass filter 306. The output of the voltage doubling rectifier unit 304 is a DC electrical signal that is provided across the load 308 which may comprise any power consuming or storing device.

The Voltage doubling rectifier unit 304 performs a rectification of the Antenna's sinusoidal AC voltage output in order to convert it to a DC voltage. However, due to the very low voltages induces in the antenna, the voltage doubling rectifier unit also acts as a voltage doubler, by doubling the voltage amplitude in order to reach higher DC voltage levels for the same input power.

The exemplary smart rectenna 300 also features a digital domain 310 which further comprises a controller unit 311. The controller unit 311 generates the appropriate control signal required to tune the operation of high pass filter 306 and voltage doubling rectifier unit 304 to a desired frequency range. The digital domain 310 also comprises a Digital to Analog Converter (DAC) 312 which couples an output of the controller unit 311 to the High Pass Filter 306. DAC 312 converts the digital control signal 313, generated by controller unit 311, to an analog tuning signal 314 for adjusting the biasing state of the tunable High Pass Filter 306. The digital domain 310 also includes a second Digital to Analog Converter (DAC) unit 316 which connects to the voltage doubling rectifier 304 and converts the digital control signal 318, generated by the controller unit 311, to an analog tuning signal 320. The analog signal 320, in turn, controls a biasing state of the tunable voltage doubling rectifier 304. The digital control domain of the exemplary rectenna system 300 also includes a memory element 322 for storing a Lookup Table 324. The tuning action of the controller unit 311, directed at the tunable components 306 and 304, is moderated by the information retrieved from the Lookup Table 324.

Comparing the example smart rectenna 300 from FIG. 3 to the conventional rectenna 100 from FIG. 1, it is observed that the exemplary smart rectenna 300 achieves rectifier to load impedance matching with a simple tunable voltage multiplier rectifier circuit, represented as voltage doubling rectifier unit 304 in FIG. 3, instead of a low pass filter, represented as DC filter 110 in FIG. 1. As described earlier, voltage doubling rectifier circuit 304 has a tunable frequency response that may be adjusted by the controller unit 311 using a Lookup Table 324.

Frequency response is a quantitative measure of the output frequency spectrum of a system or device in response to a stimulus, and may be used to characterize the dynamics of the system. In other words, it is a measure of magnitude and phase of the output signal as a function of input signal frequency. Frequency response of a system is often related to the RC time constant of the system. RC time constant, which is equal to the product of the circuit resistance and circuit capacitance, relates to the charge and discharge time of various capacitances through their associated resistors.

The frequency response of the circuit is made adjustable by using tunable capacitors 326 and 328 in the construction of the exemplary voltage-doubler rectifier 304.

The voltage doubler rectifier 304 may be considered as a modification of the single shunt diode configuration. The positive half cycle of the alternating input signal 325 (produced at the output of 306) inputted into 304 is rectified by the series diode 326 and the energy is stored in signal-controlled variable capacitor 328. The negative half cycle of the wave is rectified by the shunt diode 330 and the energy is stored in signal-controlled variable capacitor 332. The energy in signal-controlled variable capacitor 332 can be transferred to the signal-controlled variable capacitor 328 so that the voltage across the signal-controlled variable capacitor 328 is approximately two times of the peak voltage in the single series diode configuration. The breakdown voltage of the rectifier is increased hence the theoretical maximum conversion efficiency of the rectifier is also improved. Moreover, the biasing voltage of diode 326 is provided by using part of the rectified wave from diode 330 which reduces the input radio frequency power requirement (hence improving the power sensitivity). The tuning mechanism of signal-controlled variable capacitors 332 and 328 may be based on voltage control, current control or by other means of modulating electrical characteristics of the tunable capacitors that would be known to a person of ordinary skill in the arts.

Figure 4:
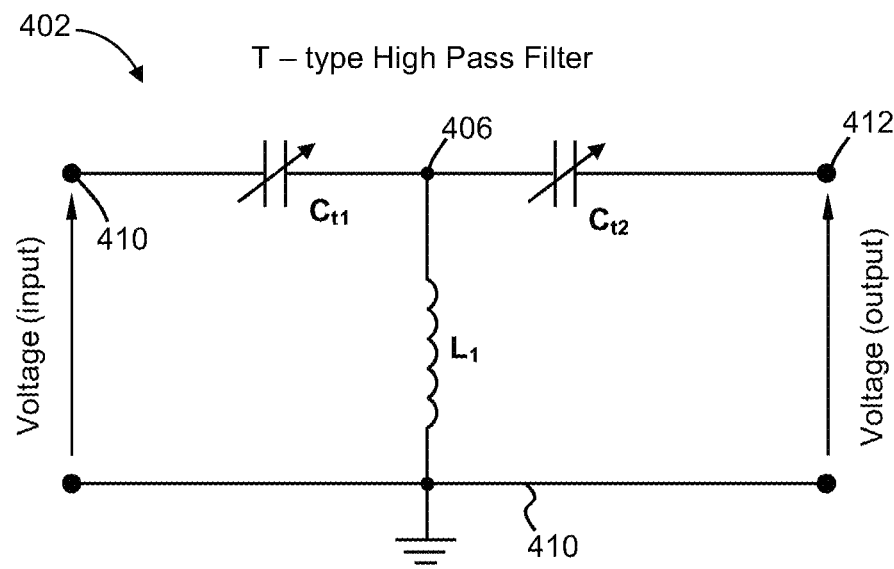
FIG. 4 illustrates two different example design implementation of a tunable High Pass Filter in accordance with some aspects of the present technology.
Figure 4:
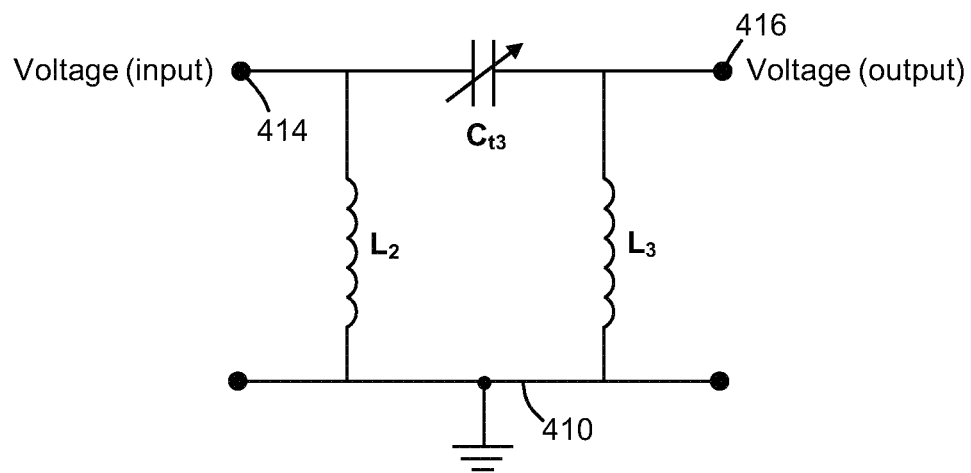

Similarly the tunable high pass filter component 306 may be constructed using tunable capacitors (signal-controlled variable capacitors) as illustrated in FIG. 4 by exemplary filter circuits 402 and 404. Filter circuit 402 and 404 represent a T-Type and a π-type high Pass Filters, respectively. High Pass Filters can tap into a radio frequency transmission path and block the lower frequency bands allowing just the higher frequencies to pass. High Pass Filter circuit 402 comprises two tunable capacitors $C_{t1}$, $C_{t2}$ connected in series and an inductor $L_1$ connected between the common node 406 and the ground terminal 408. The tunable capacitors $C_{t1}$ and $C_{t2}$ are serially connected in the path connecting the input and output terminals 410 and 412.

High Pass Filter circuit 404 comprises one tunable capacitor $C_{t3}$ disposed in the path connecting the input and the output terminal 414 and 416, respectively. Tunable capacitor $C_{t3}$ is surrounded by two inductors and $L_2$ and $L_3$ that provide a low-frequency path to the ground terminal 410 on either side of capacitor $C_{t3}$. The inductors, $L_2$ and $L_3$, shunt out the lower frequencies. In accordance with an embodiment, tunable capacitors. $C_{t1}$, $C_{t2}$ and $C_{t3}$ may comprise voltage controlled variable capacitors.

Referring back to FIG. 3, the utility of the Lookup Table 324 as part of the smart rectenna design 300, as disclosed by some embodiments, is that it can be pre-programmed with a list output configuration (for example bias levels) for a variety of specific input frequency conditions. This configuration obviates a need for performing any data processing on the rectenna system or for example on the wireless Internet of Things (IoT) sensor/device connected thereto. In this way the entire wireless charging circuitry (i.e., rectenna system) becomes a digital/analog slave device. This eliminates the processing load on the wireless sensor or the rectenna unit, thereby drastically reducing the power overhead of running the rectenna circuitry.

In some embodiments, every band and channel center frequency for the 2.4 GHz-5 GHz ISM bands may be pre-programmed into the Look up Table.

As described in reference to FIG. 3, controller unit 311 generates digital control signal 313 and 318 based on information retrieved from Lookup Table 324. The DAC units 312 and 316 convert the digital control signals 313 and 318 to analog signals 314 and 320 that are fed through to one or more signal-controlled variable capacitive elements of the analog-tunable components 306 and 304. In some embodiments, the analog tuning signals 314 and 320 interface with one or more signal-controlled variable capacitive elements of the analog-tunable components 306 and 304, in order to modify their electrical properties in such a way so as to cause the frequency response of the one or more analog-tunable components to match the dynamic conditions of the ambient input energy signal. In some embodiments of the present technology one or ore digital control signals, generated based on information retrieved from the Lookup Table, directly interface with digitally tunable circuit component of a smart rectenna as shown in FIG. 5.

Figure 5:
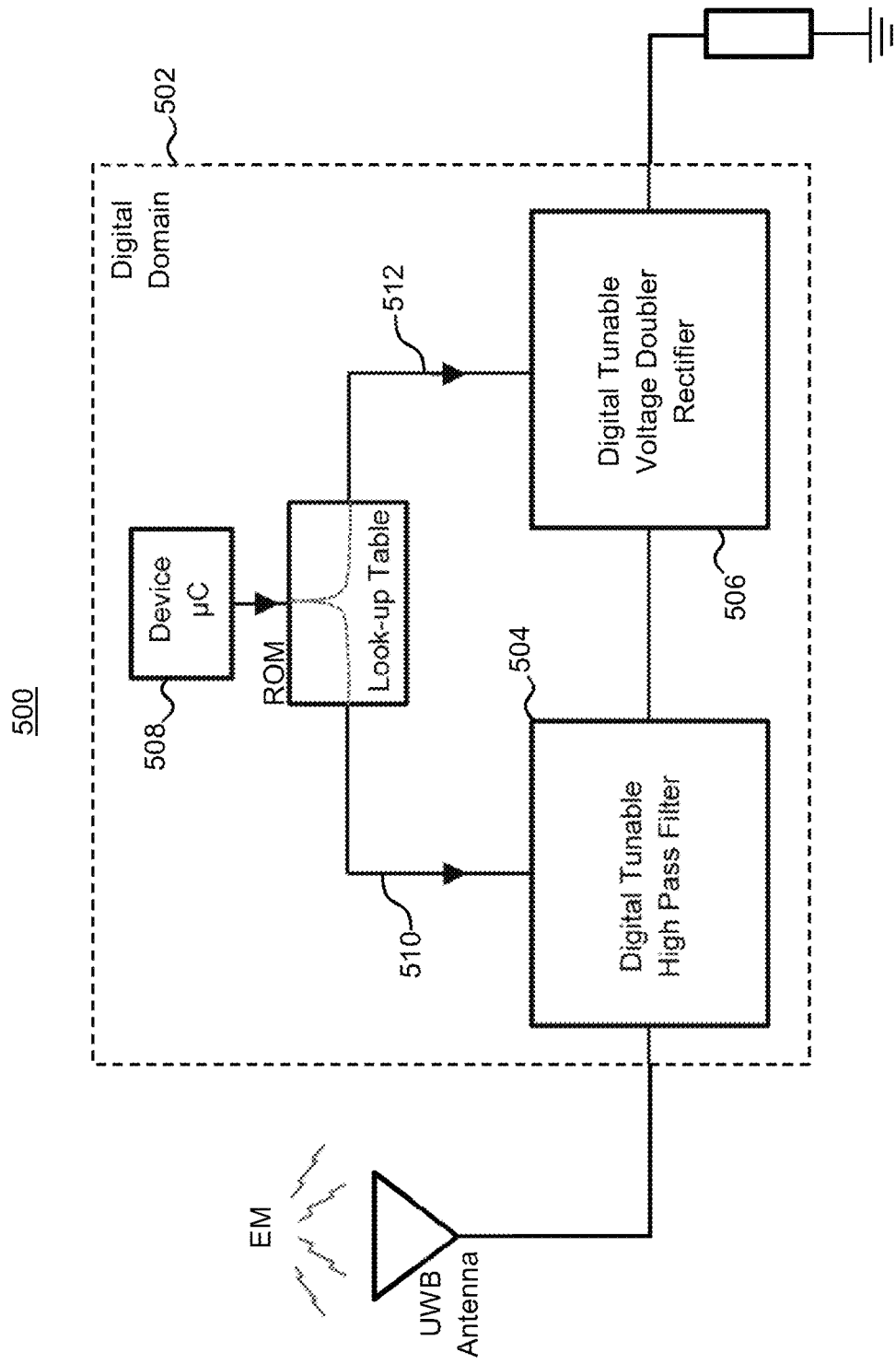
FIG. 5 illustrates an example smart rectenna design incorporating a Lookup Table and digitally tunable components, in accordance with some aspects of the present technology.

FIG. 5 illustrates an exemplary digitally tunable rectenna 500. With reference to system 500, signal processing and conditioning operations take place entirely within the digital domain 502. The configuration of system 500 only differs from that of system 300 in that it utilizes a digital tunable High Pass Filter 504 and a digital tunable voltage doubling rectifier 506, thereby obviating a need for DAC units 312 and 316. Similar to operation of the smart rectenna 300, the controller unit 508 generates digital tuning signals 510 and 512 based on information retrieved from the Lookup Table. However unlike the smart rectenna 300, the control signals 510 and 512 can directly interface with the digitally tunable circuit components 504 and 506, respectively. Therefore no Digital to Analog Converter (DAC) units are required in case of the exemplary smart rectenna 500. The tradeoff between the analog and digital approach is that the analog approach results in a faster tuning speed and a slightly lower power consumption, however it is more expensive in terms of additional circuit components than a purely digital approach.

In some embodiments of the present technology, the region of maximum power spectral density region in the incident electromagnetic energy signal may be discovered by using the approximate distances between the target device (device with the power harvesting rectenna circuitry embedded inside) and one or more nearest sources of electromagnetic radiation. In this way it would be possible to estimate path loss between the target device and the sources of electromagnetic energy signal (Free Space Path Loss model is an example of one such method). In accordance to an embodiment, a weighted algorithm that takes both the path loss and the wireless spectrum congestion (a metric that can be determined by methods similar but not limited to Clear Channel Assessment) may then be used to obtain the frequency region of maximum power spectral density in the incident electromagnetic energy signal.

Since all of these calculations and determinations will be done on the wireless network management infrastructure and not on the target device there is no power cost to the target device.

In accordance to some embodiments of the present technology, once the determination is made to change the channel (frequency response of the tunable components of the smart rectenna system), a simple low power communication protocol such as but not limited to Bluetooth will be used to send this data to the target device.

Figure 6:
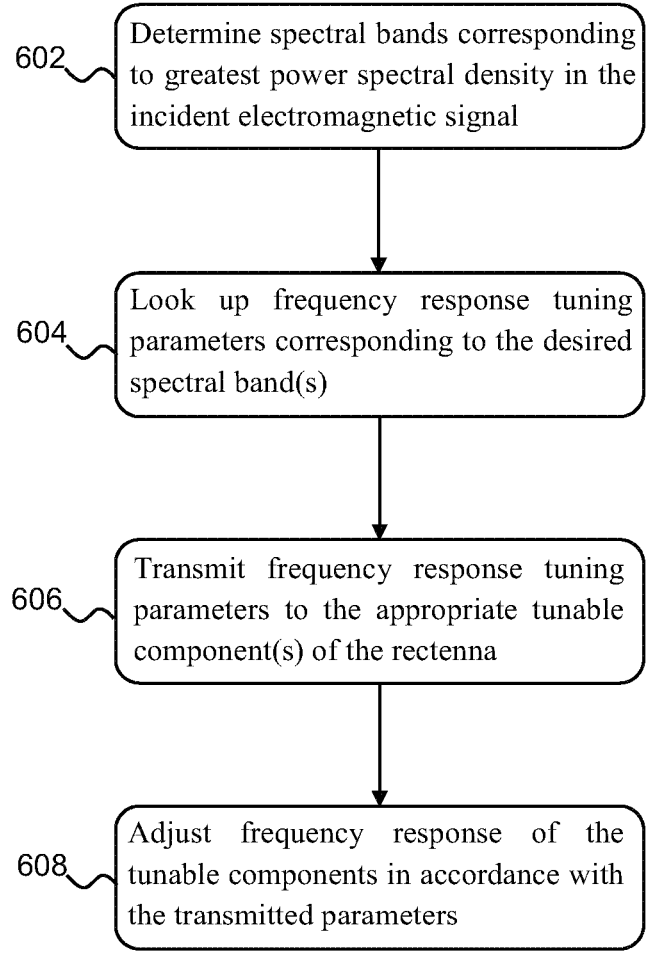
FIG. 6 illustrates an example flow chart of operational steps for harvesting ambient energy using a tunable smart rectenna, in accordance to some embodiments of the present technology

Flow chart 600 illustrated in FIG. 6 provides an operational overview for ambient energy harvesting using a tunable smart rectenna in accordance to some embodiments of the present technology. According to the example flowchart 600, spectral bands corresponding to greatest power spectral density (PSD) in the incident electromagnetic signal are determined at step 602. The operation then moves to step 604 wherein a Lookup Table containing circuit tuning parameters for frequencies in select spectral bands are searched or looked up. In some embodiments, circuit tuning parameters corresponds to parameters for tuning the frequency response of the circuit/element or component.

Referring back to flow chart 600, at step 604, circuit tuning parameters corresponding to the desired frequencies regions (incident frequencies with greatest PSD determined in step 602) are identified in the Lookup Table. At step 606, the information, corresponding to the identified parameters is communicated or transmitted to the relevant components (i.e., tunable components of the smart rectennas) or the relevant variable electrical elements (i.e., voltage controlled variable capacitors in the tunable components of the smart rectenna). The communication may be accomplished via analog or digital signals. Upon receiving the aforementioned parameters, at step 608, the frequency response of the tunable components (or the value of variable electrical element) is adjusted accordingly to maximize power transfer between different components of the smart rectenna and improve the efficiency of converting incident electromagnetic energy to direct-current electrical energy.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:
1. A system comprising:
a first component having a first tunable frequency response, the first component comprising a first input side configured to receive a radio frequency electrical signal from an antenna, a second input side configured to receive one or more tuning signals, and a first output side;
a second component having a second tunable frequency response, the second component comprising a third input side electrically coupled to the first output side of the first component, a fourth input side configured to receive one or more tuning signals and a second output side configured to deliver a direct current (DC) electrical signal to a load; and a computer-readable storage medium having stored thereon a lookup table, wherein the one or more tuning signals are configured based on information in the lookup table, wherein the information in the lookup table comprises one or more parameters to tune the first tunable frequency response of the first component and the second tunable frequency response of the second component for one or more selected spectral bands.

2. The system of claim 1, wherein the first component comprises a high pass filter.

3. The system of claim 1, wherein the first component further comprises a section that provides impedance matching between the antenna and the second component.

4. The system of claim 1, wherein the first component further comprises one or more voltage controlled variable capacitors that facilitate the first tunable frequency response.

5. The system of claim 4, wherein the one or more parameters comprise one or more voltage values to tune the one or more voltage controlled variable capacitors of the first component to thereby increase an amount of power transferred from the first component to the second component within the one or more selected spectral bands.

6. The system of claim 5, wherein the one or more tuning signals for tuning the first tunable frequency response of the first component comprise at least one of analog signals or digital signals.

7. The system of claim 1, wherein the second component comprises a rectifier unit.

8. The system of claim 1, wherein the computer-readable storage medium comprises one or more non-volatile storage elements.

9. The system of claim 1, wherein the second component further comprises a voltage doubling unit.

10. The system of claim 1, wherein the second component further comprises a section for providing impedance matching to the load.

11. The system of claim 1, wherein the second component further comprises one or more voltage controlled variable capacitors to facilitate the tunable frequency responses.

12. The system of claim 11, wherein the one or more parameters further comprise one or more voltage values to tune the one or more voltage controlled variable capacitors of the second component for maximum power transfer for each of a plurality of input radio frequencies in the one or more selected spectral bands.

13. The system of claim 1, wherein the one or more tuning signals for tuning the second tunable frequency response of the second component comprises at least one of analog signals or digital signals.

14. A method comprising:
configuring one or more tuning signals based on information from a lookup table, the information comprising on one or more parameters corresponding to one or more desired spectral bands; and transmitting the one or more tuning signals to a first component of a rectenna and a second component of the rectenna, wherein the first component has a first tunable frequency response and comprises a first input side configured to receive a radio frequency electrical signal from an antenna, a second input side configured to receive the one or more tuning signals, and a first output side, and wherein the second component has a second tunable frequency response and comprises a third input side electrically coupled to the first output side of the first component, a fourth input side configured to receive the one or more tuning signals, and a second output side configured to deliver a direct current (DC) electrical signal to a load.

15. The method of claim 14, wherein the one or more tuning signals are configured to tune the first tunable frequency response of the first component for the one or more desired spectral bands based on the one or more parameters.

16. The method of claim 14, wherein the one or more tuning signals are configured to tune the second tunable frequency response of the second component for the one or more desired spectral bands based on the one or more parameters.

17. The method of claim 14, wherein the first component comprises a high pass filter.

18. The method of claim 14, wherein the one or more parameters comprise one or more voltage values to tune one or more voltage controlled variable capacitors of the first component to thereby increase an amount of power transferred from the first component to the second component within the one or more desired spectral bands.

19. The method of claim 14, wherein the second component comprises a rectifier unit.

20. The method of claim 14, wherein the one or more parameters comprise one or more voltage values to tune one or more voltage controlled variable capacitors of the second component for maximum power transfer for each of a plurality of input radio frequencies in the one or more desired spectral bands.

* * * * *